United States Patent [19]
Amersfoort et al.

[11] Patent Number: 5,946,331
[45] Date of Patent: Aug. 31, 1999

[54] INTEGRATED MULTI-WAVELENGTH TRANSMITTER

[75] Inventors: Martin R. Amersfoort, Enschede, Netherlands; Chung-En Zah, Holmdel; Julian B. D. Soole, Edison, both of N.J.

[73] Assignee: Tellium, Inc., Oceanport, N.J.

[21] Appl. No.: 09/007,732

[22] Filed: Jan. 15, 1998

Related U.S. Application Data

[60] Provisional application No. 60/035,590, Jan. 17, 1997, and provisional application No. 60/036,003, Jan. 22, 1997.

[51] Int. Cl.$^6$ ...................................................... H01S 3/10
[52] U.S. Cl. ........................... 372/23; 350/125; 372/102; 372/64
[58] Field of Search .................................. 372/23, 26, 20, 372/98, 99, 64, 102; 359/123, 117; 385/17, 130

[56] References Cited

U.S. PATENT DOCUMENTS

| | | | |
|---|---|---|---|
| 5,351,262 | 9/1994 | Poguntke et al. | 372/102 |
| 5,444,725 | 8/1995 | Zirngibl | 372/20 |
| 5,450,431 | 9/1995 | Bernard et al. | 372/50 |
| 5,623,571 | 4/1997 | Chou et al. | 385/130 |
| 5,701,371 | 12/1997 | Ishida | 385/17 |
| 5,793,507 | 8/1998 | Giles et al. | 359/125 |
| 5,825,517 | 10/1998 | Antoniades et al. | 359/117 |
| 5,861,965 | 1/1999 | Koren et al. | 359/123 |

FOREIGN PATENT DOCUMENTS

| | | | |
|---|---|---|---|
| 0 591 042 | 4/1994 | European Pat. Off. | G02B 6/34 |

OTHER PUBLICATIONS

Hoyner et al., "An 8–Channel Digitally Tunable Transmitter with Electroabsorption Modulated Output by Selective–Area Epitaxy," IEEE Photonics Technology Letters, vol. 7, No. 9, pp. 1013–1015, Sep. 1995.

Iannone et al., "Simultaneous WDM and Broadcast Transmission Using a Single Multiwavelength Waveguide–Grat- (List continued on next page.)

*Primary Examiner*—Leon Scott, Jr.
*Attorney, Agent, or Firm*—Morgan, Lewis & Bockius LLP

[57] ABSTRACT

An integrated multi-wavelength transmitter, particularly useful in a wavelength-division multiplexed optical communications system. An arrayed waveguide grating has feedback channels between two coupling regions and is constructed such that, at each coupling region, one port carries all the optical signals of differing wavelengths while a set of other ports carry wavelength-separated signals. The multi-wavelength signal from a first coupling region is reflected from a mirrored surface back into the first coupling region and the arrayed waveguide grating, the mirrored surface thus forming one end of an optical cavity. Similar elements are arranged between corresponding single-wavelength ports of the two regions. The channel from the second coupling region is split into two parts. One part is passed through an optical gain region and is reflected back from the mirrored surface through the power splitter, now acting as a combiner. This reflection from the mirrored surface forms the second end of the optical cavity containing the gain region and provides laser operation at a single wavelength. The second part of the single-wavelength laser power from the second coupling region passes through an optical modulator and then enters wavelength-separated ports of the first coupling region. The modulator impresses a data signal upon the optical wave at the wavelength corresponding to the two ports of the two coupling regions. The arrayed waveguide grating and the second coupling region combine to transmit this single-wavelength signal with the impressed data signal to the output port carrying multiple wavelength signals. The multi-wavelength signal from the second coupling region is the output of the transmitter and contains the modulated carriers for all wavelengths. Such a transmitter is usefully applied to a wavelength-division multiplexing (WDM) fiber communication system.

12 Claims, 2 Drawing Sheets

OTHER PUBLICATIONS ing–Router Laser," IEEE Photonics Technology Letters, vol. 8, No. 10, pp. 1397–1399, Oct. 1996.

Tachikawa et al., "32 Wavelength Tunable Arrayed–Waveguide Grating Laser Based On Special Input/Output Arrangement," Electronics Letters, vol. 31, No. 19, pp. 1664/1666, Sep. 14, 1995.

Cheung et al., "Epilog Latest Advances in Dense WDM Technology," IEEE Journal on Selected Areas in Communications, vol. 8, No. 6, pp. 1214–1215, Aug. 1990.

INTEGRATED MULTI-WAVELENGTH TRANSMITTER

RELATED APPLICATIONS

This application claims benefit of U.S. Provisional Applications 60/035,590 filed Jan. 17, 1997 and 60/036,003 filed Jan. 22, 1997.

FIELD OF THE INVENTION

The invention relates generally to opto-electronic integrated circuits. In particular, the invention relates to a multi-wavelength optical transmitter including separate lasers and modulators.

BACKGROUND ART

Telecommunications networks are based in large part upon optical fiber. An electronic signal, similar to that conventionally transmitted over electrical lines in communications networks, is used to modulate the output of a laser at the transmitting site. The modulated optical signal is impressed upon an optical fiber that links the transmitting side to the receiving site. An optical detector has the receiving site detects the intensity of the optical signal, thereby regenerating the electronic signal at the transmitting site.

As the need for telecommunications bandwidth greatly increases, wavelength-division multiplexing (WDM) has been proposed as a way of multiplying the capacity of the existing optical fiber. As illustrated schematically in FIG. 1, a transmitter 10 at the transmitting site receives M electrical signals $T_1, T_2, \ldots T_M$ corresponding to multiple telecommunications channels. Conventionally, the electrical signals, after proper conditioning, are used as power supply signals to M lasers 12. Importantly, the M lasers 12 each have distinctive wavelengths $\lambda_1, \lambda_2, \ldots \lambda_m$. For silica optical fiber, the wavelengths usually are chosen to fall in a band near 1300 nm or 1550 nm. For these wavelengths, the lasers 12 can be conveniently implemented as semiconductor laser diodes built of III–V compounds such as InP, its related materials, and the like. An optical multiplexer 14 receives the modulated outputs of the lasers 12 and combines them into a single multi-wavelength signal, which is then impressed upon an optical fiber 16 which enters a communications network 18.

At the receiving site, the operation is reversed in a receiver 20 receiving a multi-wavelength signal from an optical fiber 22 exiting the optical network 18. An optical demultiplexer 24 separates the optical signals of different optical carrier wavelengths $\lambda_1, \lambda_2, \ldots \lambda_M$ and directs them to M optical detectors 26, usually implemented as photodetector diodes of InGaAs. The detectors 26 output separate electrical signals $R_1, R_2, \ldots R_M$ for M communications channels.

In a point-to-point communications system, the two fibers 16,22 are connected together and there is a one-to-one correspondence between the transmit signal $T_i$ and the receive signal $R_i$. However, in a multi-node WDM system, the optical signals can be switched within the communications network 18 and may be directed to different receivers 20. In addition, switching nodes within the network 18 may translate the signal from one wavelength to another one of those detected by the detectors 26.

For reasons of cost and reliability, much effort has been expended in integrating all or part of either the transmitter 10 or the receiver 20 onto a single integrated circuit chip. The transmitter 10 seems to present the more difficult integration. Zah has described an integrated laser array in U.S. Pat. No. 5,612,968. The multiplexer 14 can be a relatively simple star-coupler and can also be integrated on that chip. Zah et al. describe this further integration in "Wavelength accuracy and output power of multiwavelength DFB laser arrays with integrated star couplers and optical amplifiers," *IEEE Photonics Technology Letters*, vol. 8, no. 7, July 1996, pp. 864–866. However, Poguntke et al. have described in U.S. Pat. No. 5,351,262 that higher efficiencies can be obtained by using a grating in which the individual lasers or waveguides associated with them are disposed at positions corresponding to their diffraction wavelengths with respect to the grating. All the signals are then focused at an output channel. A similar use of geometry to determine the lasing wavelength is achieved with an array of waveguides instead of diffraction gratings, as disclosed by Zimgibl in U.S. Pat. No. 5,444,725.

Wavelength-division multiplexed networks with 8,16,32, 64 . . . different wavelengths are now being considered. In order to minimize fiber loss, most systems will operate within the 1550 nm low-loss band for silica fiber. In large or complex networks, optical amplification is required, and the amplifier of choice is the erbium-doped fiber amplifier (EDFA), which provides gain over the wavelength band of 1530–1610 nm, although only a small fraction of that band is currently flat enough to allow signals to pass through a number of amplifiers in series. As a result, at the present time, the usable bandwidth is restricted to 1545–1560 nm.

The requirement to support a large number of wavelengths and the need to do this with wavelengths lying within a limited wavelength band imply that the lasing wavelength of each transmitter must be held with tight wavelength tolerance; any deviation from the designed wavelengths can seriously degrade the system performance.

Details both of the laser construction and of the laser operating conditions affect the lasing wavelength. The materials and dimensions of the layers comprising the laser structure and operating conditions of current and temperature all have to be maintained within tight limits. In the case of thermal effect, the temperature of the laser may be influenced by the laser drive current, by the proximity of other heat sources within the laser package (such as other laser elements on the same semiconductor chip), and by the external ambient temperature.

Accurate control of the wavelength of laser emission is one of the prime challenges of laser design for WDM systems.

SUMMARY OF THE INVENTION

The invention includes an arrayed waveguide grating with two coupling regions at its end. Between corresponding single-wavelength ports of the two coupling regions are arranged a feedback path including a power splitter, a modulator receiving a first output of the power splitter, and a reflector receiving the second output of the power splitter and reflecting the signal back through the power splitter back to the grating. Separate gain regions are disposed between in the paths passing through the second outputs of the respective power splitters. A multi-wavelength port of one of the coupling regions is connected to an optical path that is strongly reflected back into that coupling region. A multi-wavelength port of the other of the coupling regions provides the output of a multi-wavelength signal having wavelength components modulated by the respective modulators.

The invention allows one or more modulators to be placed substantially outside of the laser cavity, thereby enabling very high-speed modulation.

The invention also allows multiple gain region within the laser cavity so as to minimize inter-channel interference.

The invention further integrates multiple data modulators with an optical wavelength multiplexer to provide a single output including multiple-wavelength signals.

The invention is usefully incorporated as a multi-wavelength transmitter into a wavelength-division multiplexing (WDM) communications network based upon optical fiber, particularly one having a varying number of active WDM transmitting wavelengths.

DETAILED DESCRIPTION OF THE PREFERRED EMBODIMENTS

Figure 2:
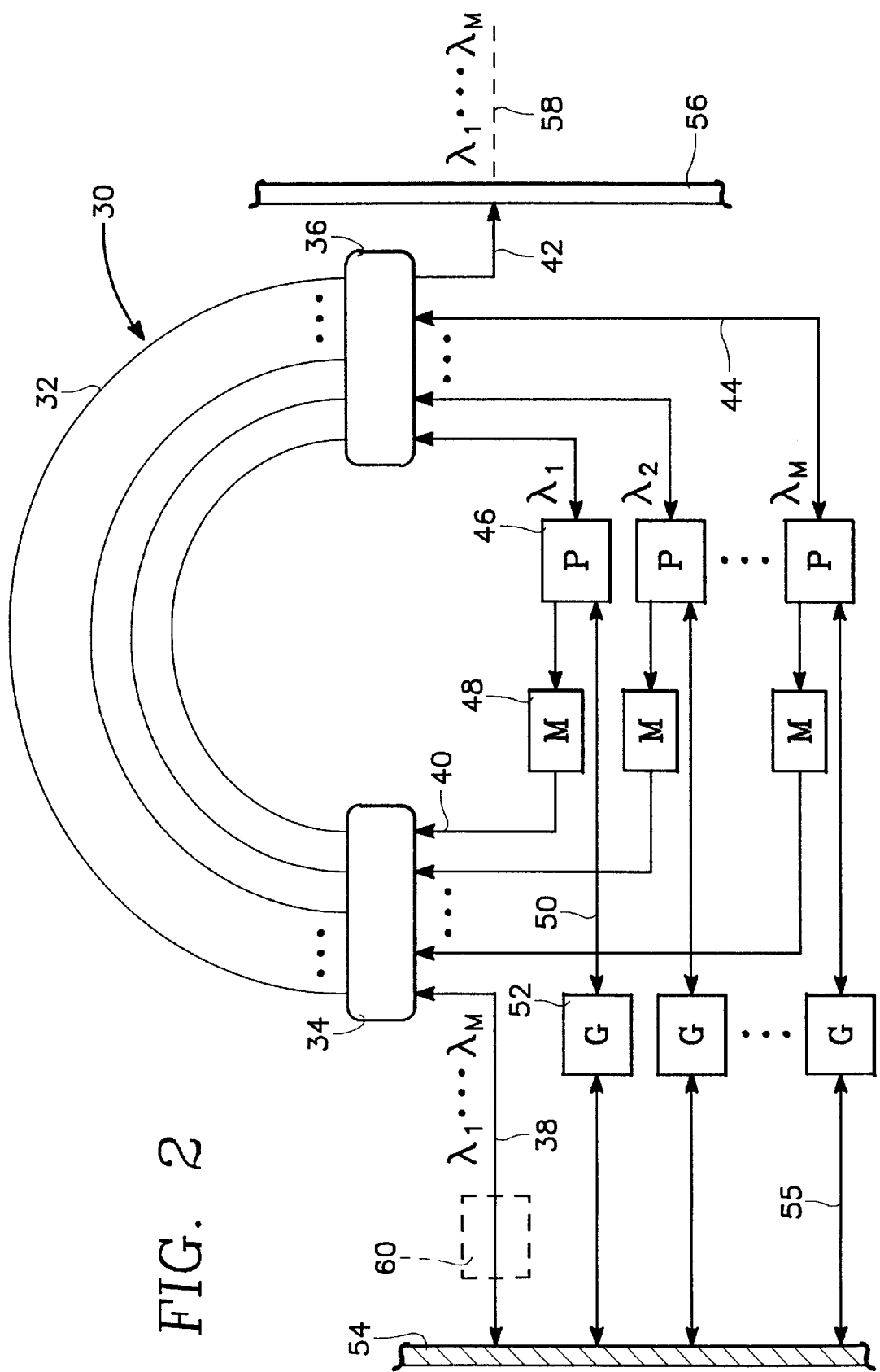
FIG. 2 is a schematic diagram of one embodiment of a multi-wavelength laser array of the invention.

The described embodiment of the invention combines the functions of a laser array and a wavelength multiplexer with an array of modulators that are external to the laser cavity and act prior to the wavelength division multiplexing function. As illustrated in the opto-electronic circuit diagram of FIG. 2, an arrayed waveguide grating 30 includes multiple grating optical waveguides 32 connected between two star coupling regions 34,36. Importantly, the multiple grating waveguides 32 have lengths differing in a controlled amount of phase difference between neighboring waveguides 32. This structure is well known and has been disclosed by Dragone et al. in U.S. Pat. No. 5,136,671 and by Zirngibl in U.S. Pat. No. 5,44,725 Improvements on the waveguide grating have been disclosed by Chou et al. in U.S. Pat. No. 5,623,571, by Amersfoort et al. in U.S. Pat. No. 5,629,992, by Soole et al. in "Use of multimode interference couplers to broaden the passband of dispersive integrated WDM filters," *Technical Digest*: 1996, Integrated Photonics Research Conference, Boston, Mass., Apr. 29–May 2, 1996, pp. 44–47478–481, and by Amersfoort et al. in "Polarization-independent InP-arrayed waveguide filter using square cross-section waveguides," *OFC'96 Technical Digest*, vol.2, Optical Fiber Conference, San Jose, Calif., Feb. 25–Mar. 1, 1996, pp. 101, 102.

One feedback optical waveguide 38 and M first external optical waveguides 40 are connected to the first coupling region 34. Similarly, one output optical waveguide 42 and M second external optical waveguides 44 are connected to the second coupling region 36. The system described to this point is designed for a wavelength-division multiplexed (WDM) system having M wavelengths $\lambda_1, \lambda_2, \ldots \lambda_M$. The placements of the waveguides 32,38,40,42,44 abutting the two coupling regions 34,36 are such that the feedback waveguide 38 and output waveguides 42 are connected to ports of the coupling regions 34,36 carrying all the WDM wavelengths $\lambda_1, \lambda_2, \ldots \lambda_M$ while the M external waveguides 40,44 are connected to ports carrying only a respective one of the wavelengths $\lambda_1, \lambda_2, \ldots \lambda_M$. That is, the feedback and output waveguides 38,42 are connected to multi-wavelength ports of the coupling regions 34,36, while the external waveguides 40,44 are connected to single-wavelength ports.

The structure of the array waveguide grating 30 and of the coupling regions 34,36 is such that the multi-wavelength signal on the feedback waveguide 38 is coupled to the single-wavelength signals on the second external waveguides 44 and the multi-wavelength signal on the output waveguide 42 is coupled to the single-wavelength signals on the first external waveguides 40.

Each of the second external waveguides 44, that is, a waveguide carrying only one wavelength $\lambda_i$, is connected from a single-wavelength port of the second coupling region 36 to an input of a respective optical power splitter 46 additionally having two outputs. One output is connected via a modulator 48 to the first external waveguide 40 of corresponding wavelength. Each modulator 48 selectively modulates the intensity of the optical signal passing through it, typically in a binary, off-on mode. The external waveguides 40 carry the outputs of the modulators 48 to the first coupling region 34, from where the modulated radiation again traverses the arrayed waveguide grating 30, is optically multiplexed with other wavelengths, and is output on the output waveguide 42.

The other output of the power splitter 46 is connected via a waveguide 50 or otherwise to a gain region 52. The output of the gain region 52 is incident upon a highly reflective surface 54, hereinafter referred to as the mirror 54. However, a short wavelength-separated mirror-amplifier waveguide 55 may be interposed. The mirrors 54 may be a metal coating or a dielectric coating of closely controlled thickness on the facet of the chip to which the gain region 52 abuts.

Methods of fabricating the modulators 48, the gain regions 52, and the transitions between active and passive waveguides are described by Coldren in "Lasers and modulators for OEICs,", *Integrated Optoelectronics*, eds. Dagenais et al., (Academic Press, 1994), Chapter 10, pp. 339, 397–417, by Koch et al. in "Photonic integrated circuits," ibid., Chapter 15, pp. 557–579, 596–613, 619–626., and by Joyner et al. in "An 8-channel digitally tunable transmitter with electroabsorption modulated output by selective-area epitaxy," *IEEE Photonics Technology Letters*, vol. 7, no. 9, September 1995, pp. 1013–1015. Amersfoort et al. describe an electroabsorption modulator in "Performance study of a 10-wavelength DFB laser array with integrated electroabsorption modulators," *Conference Proceedings: LEOS'96*, IEEE Lasers and Electro-Optics Society 1996 Annual Meeting, 18–21 November 1996, Boston, Mass., vol. 2, pp. 335, 336. Since the modulators are dedicated to particular wavelengths, their individual design can be optimized to their own wavelengths. Soole et al. describe the integration of a mirror with an arrayed waveguide grating in "High performance polarization-independent WDM filtering using an InP reflective arrayed waveguide coating," ibid., pp. 228, 229. Tomlinson et al. have described the fabrication of waveguides and Y-couplers in "Integrated optics: basic concepts and techniques," *Optical Fiber Telecommunications II*, eds. Miller et al., (Academic Press, 1988), pp. 355–363. Alternatively, multimode interference couplers may be used, as described by Soldano in *Multimode Interference Couplers: Design and Applications*, ISBN 90-407-1044-9, (Delft Univ. Press, 1994).

Due to the configuration of the waveguides around the waveguide grating 30, each gain region 52 receives and amplifies an optical signal of only a single wavelength $\lambda_i$.

The mirror 54 also reflects the multi-wavelength signals traveling in the feedback waveguide 38. Although the mirror 54 is depicted as a single reflecting element, the mirror that reflects the signal in the feedback waveguide 38 can be separate from the mirror that reflects the signal in the wavelength-separated waveguides 55.

The output waveguide 42 connected at one end to the second coupling region 36 has its other end incident on a face 56. The face 56 may be coated with an anti-reflection coating to reduce reflections of back into the output guide 42. A common configuration places the two faces 54,56 at the facets of the semiconductor chip.

A multi-wavelength signal traveling backwards in the feedback waveguide 38 toward the arrayed waveguide 30 enters the first coupling region 34, passes through the grating waveguides 32, and enters the second coupling region 36. In this passage, the signals of different wavelengths spatially disperse and interfere in the second coupling region 36 so that wavelength-separated signals enter the second external waveguides 44. The wavelength-separated signals pass through respective ones of the power splitters 46. A split portion of the wavelength-separated signals exiting a first port of the power splitter 46 passes through a respective one of the gain regions 52 and is amplified therein. After being reflected from the mirror 54, the wavelength-separated signals again pass through their own gain regions 52 and pass via the first ports through the respective power splitters 46, now operating as power-combiners, and enter the second coupling region 36. The multi-wavelength signal propagates from the second coupling region 36 through the grating waveguides 32 and is recombined in the first coupling region 34 in the first coupling region 34 as it enters the feedback waveguide 38.

The combined signal on the feedback waveguide 38 is reflected by the mirror 54 and re-enters the first coupling region 34 and repeats the inverse of the preceding path. The optical paths just described constitute optical resonators for the various wavelengths, each wavelength signal being supplied with gain by a respective one of the gain regions 52. That is, one optical cavity is defined at both ends by the mirror 54, with one end passing through the feedback waveguide 38 and the other end passing through the gain region 52 and the mirror-amplifier waveguides 55. If the gain supplied by each gain element 52 is greater than the round-trip loss, lasing will occur in the resonator.

The modulator 48 is disposed between a second port of a respective one of the power splitters 56 and the first coupling region 34. Thereby, some of the power in each wavelength-separated resonator is tapped from the resonator by the optical splitter 46 to be modulated by the respective modulator 48. As a result, the modulator 48, controlled by a respective electronic data signal, amplitude modulates the wavelength-separated light as it enters the first coupling region 34. After passing through the arrayed waveguides 32, the respectively modulated signals of different wavelengths are recombined in the second coupling region 36 into a combined multi-wavelength signal exiting the second coupling region on the output waveguide 42. Each modulator 48 therefore operates as a wavelength-specific output switch. The modulated multi-wavelength signal exits the illustrated structure on a waveguide, fiber, or other optical path 58.

The gain of each lasing wavelength signal is determined by the gain provided by the respective gain element 52 and the modulation of the laser power at that wavelength provided by the respective modulator 48. The symmetrical combination of the waveguide array grating 30 and the first and second coupling regions 34,36, together with the relative positions of the connecting waveguides 38,40,44,42 simultaneously enhance two functions: (1) separation of the multi-wavelength signal traveling in the feedback waveguide 38 into the wavelength-separated signals traveling in the second external waveguide 44; and (2) recombination of the same wavelength-separated signals traveling in the second external waveguides 40 into a multi-wavelength signal borne on the common output waveguide 42. Use of a common structure to provide the two functions assures that the wavelengths are demultiplexed and re-multiplexed the same, and this dual use of common structure is an important feature of the invention.

The modulators 48 are outside of the respective optical cavities, but can selectively tap a fraction of the resonating power toward the output. The placement of the multiple modulators 48 outside this cavity allows high-speed modulation of the separate wavelength signals.

The structure is particularly advantageous in that it eliminates the need for a separate external optical multiplexer connected to the outputs of an multi-wavelength laser array to combine the multi-wavelength signals.

Various modifications to this circuit are possible. The individual gain regions 52 may be moved to the second external waveguides 44 between the input to the power splitter 46 and the second coupling region 36 or gain regions may be included in both locations. However, in this position, it is more difficult to control the frequency of the different lasing signals.

It is also possible to include another gain region 60 associated with the feedback waveguide 38. This would be most appropriate if the device were to be operated at a only single wavelength at a time. Such a common gain region amplifies all the signals passing through it, and hence the output power of the wavelengths is difficult to control because of amplifier saturation in the presence of a varying number of separately activatable wavelengths.

In common with other integrated lasers based on geometrical cavity designs, such as disclosed by Poguntke et al., Zirngibl et al. and Chou et al., the laser wavelengths are accurately determined by the geometry of the physical layout and cannot change individually without corresponding changes to all wavelengths. The set of lasing wavelengths can shift in unison if the temperature of the laser chip changes because the effective refractive index of the structure may vary with temperature. The concurrent change of all wavelengths is an attractive feature of such lasers.

Figure 1:
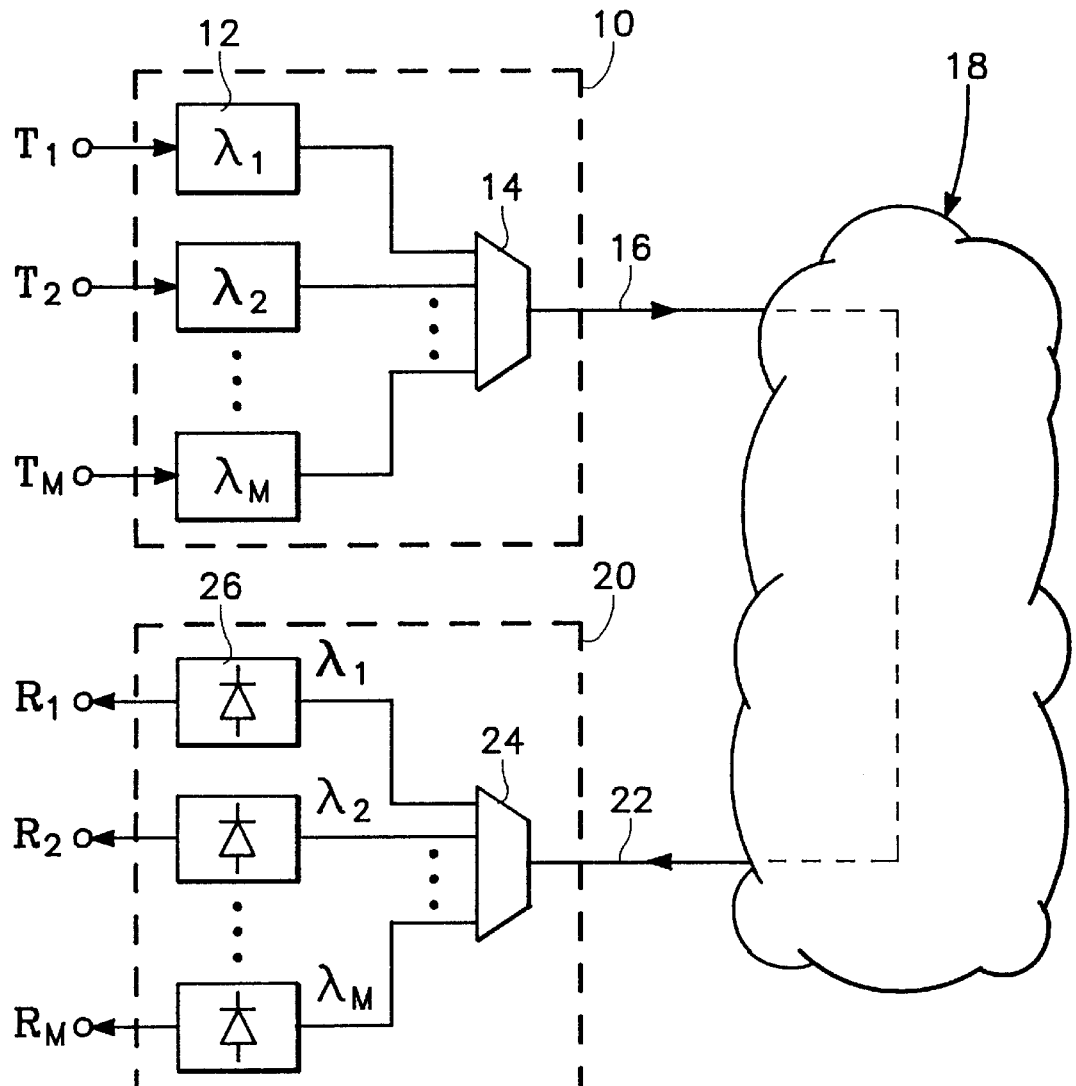
FIG. 1 is a network diagram of a WDM communications network in which the invention is useful.

In the system of FIG. 1, the output channel 58 is connected to the optical fiber 16 entering the communications network 18. Because the multi-wavelength signal is output on a single optical channel, only a single fiber pigtail is required. In the transmitter of the WDM system, separate electrical data signals $T_1, T_2, \ldots T_M$ control the modulators 48. Drive currents to the gain elements 52 control the average output power at each wavelength.

It is seen that the modulation is performed independently of the gain. During the modulated transmission of a signal at a particular wavelength, its gain region is left on. Furthermore, the gain regions are separate for each wavelength. If one signal is inactive, the amplification factor for the other signals remains the same. However, it is recommended that all gain regions be left on even if one or more of the channels is inactive so that the thermal characteristics remain the same.

The device may be used as a source for a signal at a single but selected wavelength, in which case the lasing wavelength is selected by providing gain to the appropriate gain element 52 and activating the associated modulator 48. The presence of a different modulator for each lasing wavelength permits a structure to be designed having the different modulators optimized for their particular wavelengths so that the entire structure is suitable for lasing over a wide range of wavelengths. If instead a single modulator structure were to be used, design compromises would be required in order to permit modulation to be a achieved over a wide wavelength band. This design is also advantageous since different networks may have different sets of WDM wavelengths or even a particular single wavelength in a non-WDM network. A single chip could be designed with many such sets a wide selection of single wavelengths, but only one of the sets or one particular wavelength is electronically activated. Thereby, the size of the inventory can be reduced.

Although the invention is most advantageously applied to an integrated chip, it can also be applied to discrete components.

The invention thus provides a multi-wavelength laser transmitter of high wavelength accuracy that is able to separately modulate at high speed each of the constituent wavelength signals but with very low cross talk and reduced thermal effects. Nonetheless, the transmitter is easily achievable with presently available technology.

What is claimed is:

1. A multi-wavelength laser comprising:
   a waveguide array grating having a first end and a second end, said first end having a first multi-wavelength port and a plurality of first single-wavelength ports, said second end having a second multi-wavelength port and a plurality of second single-wavelength ports, said second multi-wavelength port providing an output of said multi-wavelength laser;
   an optically reflective surface disposed at an end of an optical path connected at the other end to said first multi-wavelength port; and
   for corresponding ones of said first and second single-wavelength ports
      an optical power splitter and an optical modulator disposed in series between said first and second single-wavelength ports, said power splitter and modulator being connected by a first output of said power splitter,
      an optical reflector receiving a light signal from said second output of said power splitter and reflecting it back thereto, and
      a gain medium disposed in a path between said one of said first and second single-wavelength ports and said reflector and passing through said second output of said power splitter.

2. The multi-wavelength laser of claim 1, wherein said gain medium is disposed between said second single-wavelength port and said reflector.

3. The multi-wavelength laser of claim 2, wherein said gain medium is disposed between said second output of said power splitter and said reflector.

4. The multi-wavelength laser of claim 1, wherein said waveguide array grating, said power splitters, said modulators, and said gain media are formed in a single semiconducting substrate.

5. The multi-wavelength laser of claim 4, wherein all of said reflectors are formed by a coating on an edge of said substrate.

6. The multi-wavelength laser of claim 5, additionally comprising an anti-reflective coating formed on an edge of said substrate through which said output of said multi-wavelength laser exits said substrate.

7. The multi-wavelength laser of claim 1, wherein an input of said power splitter is connected to said second single-wavelength port and an output of said modulator is connected to said first single-wavelength port.

8. A multi-wavelength laser, comprising:
   a structure including an optical grating and having a first end and a second end;
   a first reflective portion coupled to a multi-wavelength port of said first end of said grating to reflect light back to said multi-wavelength port of said first end;
   an output waveguide having a first end connected to a multi-wavelength port of a second end of said grating; and
   plurality of wavelength-separated connections, each comprising respective ones of
      a power splitter having an input connected to a single-wavelength port of said second end of said grating,
      a selectively actuated modulator having a first side connected to a first output of said power splitter and a second side connected to a single-wavelength port of said first end of said grating, and
      a gain region have a first side connected to a second output of said power splitter and a second side connected to a reflective portion to reflect light therefrom back to said gain region.

9. The multi-wavelength laser of claim 8, wherein said structure comprises an arrayed waveguide grating.

10. The multi-wavelength laser of claim 8, wherein said reflective portions comprise a reflective surface of a chip incorporating said multi-wavelength laser.

11. A wavelength-division multiplexed (WDM) communications network, comprising:
   a network comprising at least one optical fiber;
   an optical transmitter connected to said at least one optical fiber and transmitting thereon a first multi-wavelength signal comprising a plurality of first data signals impressed upon a corresponding plurality of optical carriers of respective first optical wavelengths; and
   an optical receiver connected to said at least one optical fiber and receiving therefrom a second multi-wavelength signal comprising a plurality of second data signals impressed upon a second corresponding plurality of optical carriers of respective second optical wavelengths;
   wherein said transmitter comprises:
      a waveguide array grating having a first end and a second end, said first end having a first multi-wavelength port and a plurality of first single-wavelength ports corresponding to said first optical wavelengths, said second end having a second multi-wavelength port and a plurality of second single-wavelength ports corresponding to said first optical wavelengths, said second multi-wavelength port being connected to said at least one optical fiber;
      a first optical reflector disposed at the end of an optical path connected at the other end to said first multi-wavelength port; and for corresponding ones of said first and second single-wavelength ports an optical power splitter and an optical modulator disposed in series between said first and second single-wavelength ports, said power splitter and modulator being connected by a first output of said power splitter, wherein said optical modulator is controlled by a respective one of said first data signals, a second optical reflector receiving a light signal from said second output of said power splitter and reflecting it back thereto, and a gain medium disposed in a path between said one of said first and second single-wavelength ports and said second reflector, said path passing through said second output of said power splitter.

12. The network of claim 11:

wherein said power splitter has an input connected to said second single-wavelength port;

wherein said modulator is connected to a first output of said power splitter; and wherein said gain medium is disposed between a second output of said power splitter and said second reflector.

* * * * *

UNITED STATES PATENT AND TRADEMARK OFFICE
CERTIFICATE OF CORRECTION

PATENT NO. : 5,946,331  
DATED : August 31, 1999  
INVENTOR(S) : Martin R. Amersfoort et al.

Page 1 of 1

It is certified that error appears in the above-identified patent and that said Letters Patent is hereby corrected as shown below:

<u>Column 8, claim 8,</u>  
Line 10, insert -- a -- before "plurality".

Signed and Sealed this

Second Day of April, 2002

Attest:

Attesting Officer

JAMES E. ROGAN  
Director of the United States Patent and Trademark Office